(12) United States Patent
Kim et al.

(10) Patent No.: US 11,532,657 B2
(45) Date of Patent: Dec. 20, 2022

(54) IMAGE SENSOR AND IMAGING APPARATUS HAVING THE SAME

(71) Applicant: Samsung Electronics Co., Ltd., Suwon-si (KR)

(72) Inventors: Daekwan Kim, Suwon-si (KR); Yohwan Noh, Jeongeup-si (KR); Chaesung Kim, Seoul (KR); Keunyung Byun, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 236 days.

(21) Appl. No.: 16/855,384

(22) Filed: Apr. 22, 2020

(65) Prior Publication Data

US 2021/0066375 A1    Mar. 4, 2021

(30) Foreign Application Priority Data

Sep. 4, 2019 (KR) .................. 10-2019-0109666

(51) Int. Cl.
| | | |
|---|---|---|
| *H01L 27/146* | (2006.01) | |
| *G02B 5/20* | (2006.01) | |
| *G02B 3/00* | (2006.01) | |
| *H04N 5/335* | (2011.01) | |

(52) U.S. Cl.
CPC ...... *H01L 27/14627* (2013.01); *G02B 3/0006* (2013.01); *G02B 5/201* (2013.01); *H01L 27/1463* (2013.01); *H01L 27/14621* (2013.01); *H01L 27/14645* (2013.01); *H04N 5/335* (2013.01)

(58) Field of Classification Search
CPC ......... H01L 27/14627; H01L 27/14621; H01L 27/1463; H01L 27/14645; H01L 27/1462; G02B 3/0006; G02B 5/201; G02B 3/0056; H04N 5/335; H04N 5/347; H04N 5/2251; H04N 5/2253; H04N 5/2254; H04N 5/369; H04N 9/0455
See application file for complete search history.

(56) References Cited

U.S. PATENT DOCUMENTS

| | | |
|---|---|---|
| 8,629,930 B2 | 1/2014 | Brueckner et al. |
| 9,313,432 B2 | 4/2016 | Pyeoun |
| 9,343,492 B2 | 5/2016 | Jin et al. |

(Continued)

OTHER PUBLICATIONS

Choi et al. "In-Pixel Aperture CMOS Image Sensor for 2-D and 3-D Imaging," IEEE Sensors Journal, Nov. 15, 2018, p. 9163-9168, vol. 18, No. 22.

*Primary Examiner* — Gevell V Selby
(74) *Attorney, Agent, or Firm* — Harness, Dickey & Pierce, P.L.C.

(57) ABSTRACT

An image sensor includes a plurality of pixels configured to receive an optical signal incident through a first lens portion; a planarization layer that has a same refractive index as a refractive index of the first lens portion; a second lens portion that is configured to classify the optical signal incident through the first lens portion according to an incidence angle, and is configured to deliver the optical signal to each of the plurality of pixels; and image processing circuitry configured to generate a subject image by combining one or more subimages obtained from the optical signal, wherein the planarization layer is arranged between the second lens portion and the plurality of pixels.

16 Claims, 23 Drawing Sheets

(56) References Cited

U.S. PATENT DOCUMENTS

| | | | |
|---|---|---|---|
| 9,392,187 B2 | 7/2016 | Tulyakov et al. | |
| 9,826,215 B2 | 11/2017 | Yamazaki | |
| 9,866,810 B2 | 1/2018 | Knight et al. | |
| 9,924,084 B2 | 3/2018 | Ono | |
| 9,936,121 B2 | 4/2018 | Kawakami | |
| 9,948,849 B2 | 4/2018 | Kim et al. | |
| 10,002,440 B2 | 6/2018 | Chien | |
| 10,104,324 B2 | 10/2018 | Hirota | |
| 10,812,747 B2* | 10/2020 | Nojima | H04N 5/374 |
| 2008/0030596 A1 | 2/2008 | Sung et al. | |
| 2011/0273602 A1* | 11/2011 | Takamiya | H04N 5/232122 |
| | | | 348/E5.091 |
| 2013/0128087 A1 | 5/2013 | Georgiev et al. | |
| 2018/0139417 A1 | 5/2018 | Chang | |
| 2018/0249064 A1* | 8/2018 | Kim | H04N 5/232122 |
| 2019/0074307 A1* | 3/2019 | Kita | H04N 5/369 |
| 2019/0096945 A1 | 3/2019 | Lu et al. | |
| 2019/0104242 A1 | 4/2019 | Wippermann et al. | |
| 2020/0075652 A1* | 3/2020 | Chen | H04N 13/344 |

\* cited by examiner (binning)

IMAGE SENSOR AND IMAGING APPARATUS HAVING THE SAME

CROSS-REFERENCE TO THE RELATED APPLICATION

This application claims benefit of priority to Korean Patent Application No. 10-2019-0109666 filed on Sep. 4, 2019 in the Korean Intellectual Property Office, the disclosure of which is incorporated herein by reference in its entirety.

BACKGROUND

1. Field

The present disclosure relates to an image sensor and an imaging apparatus including the same.

2. Description of Related Art

An image sensor is a semiconductor-based sensor onto which light is irradiated to produce an electrical signal, which may include a pixel array having a plurality of pixels, a logic circuit for driving the pixel array and generating an image, and the like. The pixels may include a photodiode generating charges in response to light, and a pixel circuit outputting a pixel signal using the charges generated by the photodiode.

As the electronic devices become smaller, the sizes of pixels included in the image sensor also decrease. However, as the sizes of the pixels decrease, the light sensitivity of the image sensor may decrease. To compensate for the same, the depth of field (DOF) may decrease when the F-number is lowered.

SUMMARY

An aspect of the present disclosure is to provide an image sensor capable of extending a depth of field (DOF) while maintaining light sensitivity.

According to at least some example embodiments of the inventive concepts, an image sensor includes a plurality of pixels configured to receive an optical signal incident through a first lens portion; a planarization layer that has a same refractive index as a refractive index of the first lens portion; a second lens portion configured to classify the optical signal incident through the first lens portion according to an incidence angle, and configured to deliver the optical signal to each of the plurality of pixels; and image processing circuitry configured to generate a subject image by combining one or more subimages obtained from the optical signal, wherein the planarization layer is arranged between the second lens portion and the plurality of pixels.

According to at least some example embodiments of the inventive concepts, an image sensor includes a microlens configured to split a first optical signal incident through a main lens into a plurality of second optical signals according to an incidence angle; a plurality of pixels arranged below the microlens and separated by at least one element isolation layer; and a planarization layer that is arranged between the microlens and the plurality of pixels, and is configured to focus the plurality of second optical signals onto a photodiode included in each of the pixels; and image processing circuitry configured to control a width of an opening of the main lens, based on a number of images, among the first images, to be combined, wherein the pixels are configured to obtain a plurality of first images of a subject by detecting the plurality of second optical signals.

According to at least some example embodiments of the inventive concepts, an imaging apparatus includes a first lens portion configured to pass an optical signal incident from a subject; a plurality of pixels each including a photodiode arranged on a semiconductor substrate, plurality of pixels being configured to obtain an image of the subject by detecting the optical signal; a circuit layer that is arranged below the plurality of pixels and includes at least one semiconductor element configured to obtain pixel values by driving the pixels; a second lens portion that is arranged between the first lens portion and the plurality of pixels and is configured to classify the optical signal according to an incidence angle to deliver the optical signal to the pixels; and a planarization layer that is arranged between the second lens portion and the plurality of pixels.

BRIEF DESCRIPTION OF DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Figure 1A:
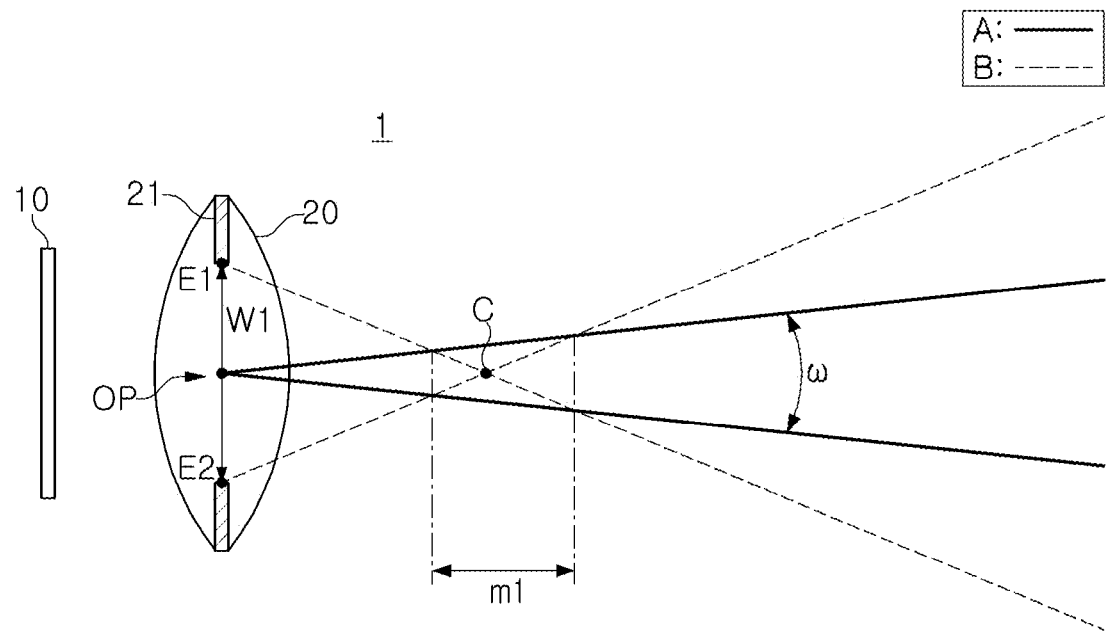
FIGS. 1A and 1B are diagrams provided to describe a DOF of an imaging apparatus.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 1B:
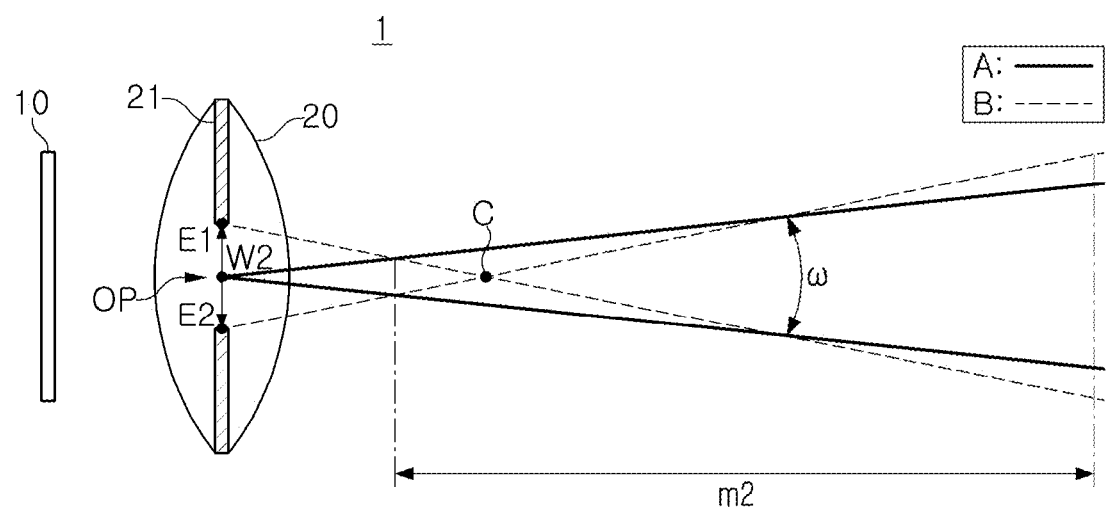

FIGS. 1A and 1B are diagrams provided to describe a DOF of an imaging apparatus.

Referring to FIG. 1A, an imaging apparatus 1 may include an image sensor 10 and a main lens 20. The image sensor 10 may include a plurality of light sensing elements, for example, photodiodes, and receive an optical signal which has passed the main lens 20 and generate an electric signal, thereby obtaining an image of a subject.

A width of an opening OP of the main lens 20 may be adjusted by an iris. When the opening OP of the main lens 20 has a first opening width w1, the depth of field (DOF) of the imaging apparatus 1 may be defined as a region m1 in which lines A representing an angle of view ω of the main lens 20 and a point C, on which a focal point of the main lens is centered at both ends E1 and E2 of the opening OP intersect.

The DOP is a range over which an image obtained by the image sensor 10 is focused and may be inversely proportional to the opening width of the main lens 20. For example, referring to FIG. 1B, when the main lens 20 has a narrower second opening width w2 than the first opening width w1, the DOF of the imaging apparatus 1 may have a larger area m2 than that of FIG. 1A.

Meanwhile, light sensitivity of the image sensor 10 may be reduced as sizes of pixels included in the image sensor are reduced. When an F-number is lowered by increasing the opening width to improve light sensitivity of the image sensor 10, the DOF of the imaging apparatus 1 may be reduced. To solve such a problem, an aspect of the present disclosure is to extend a DOF of an image sensor according to at least one example embodiment of the inventive concepts while maintaining the light sensitivity. Hereinafter, the image sensor according to at least one example embodiment of the inventive concepts will be described in more detail with reference to the accompanying drawings.

Figure 2A:
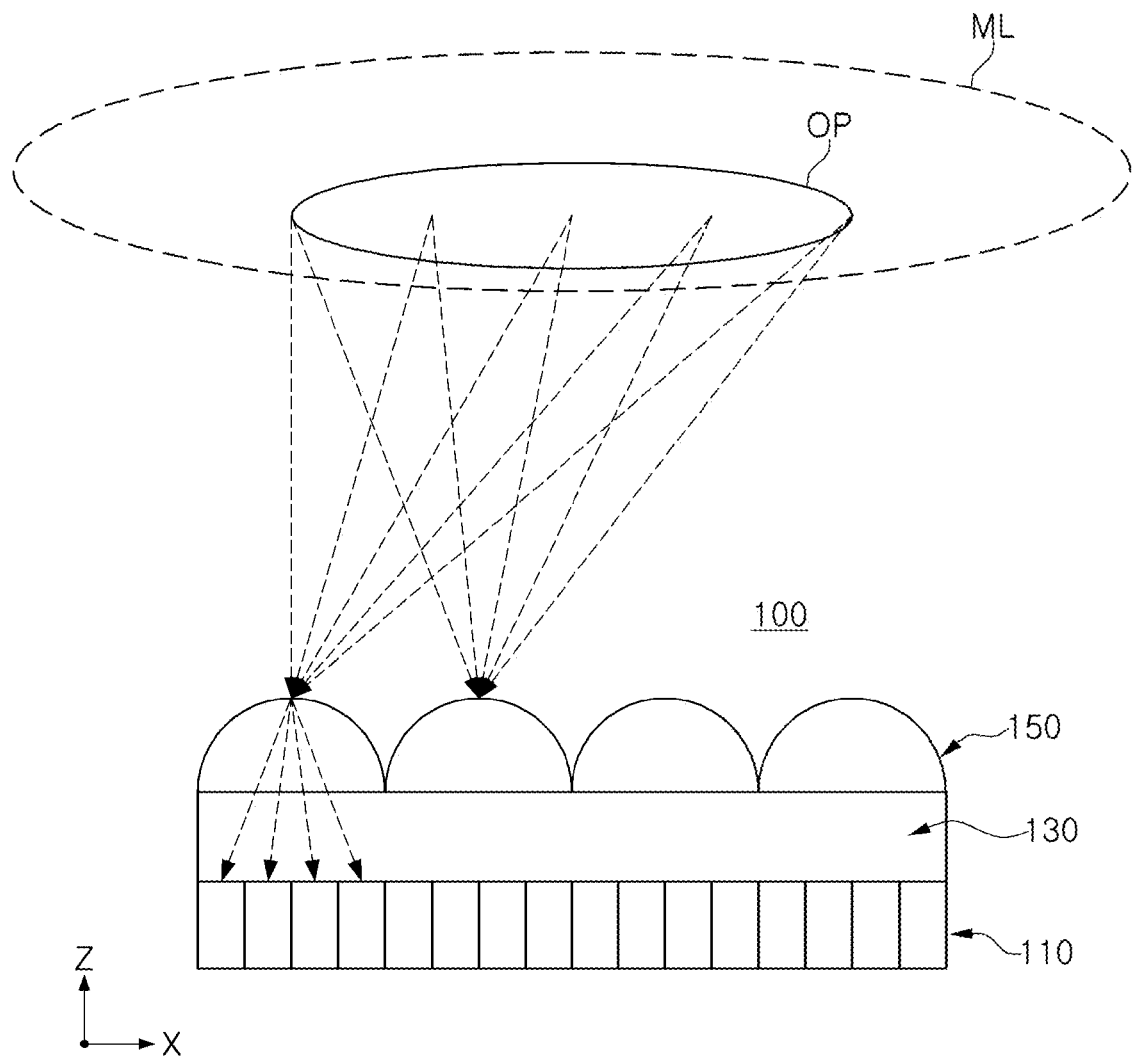
FIGS. 2A and 2B are diagrams provided to describe an image sensor according to at least one example embodiment of the inventive concepts of the present disclosure.
Figure 2B:
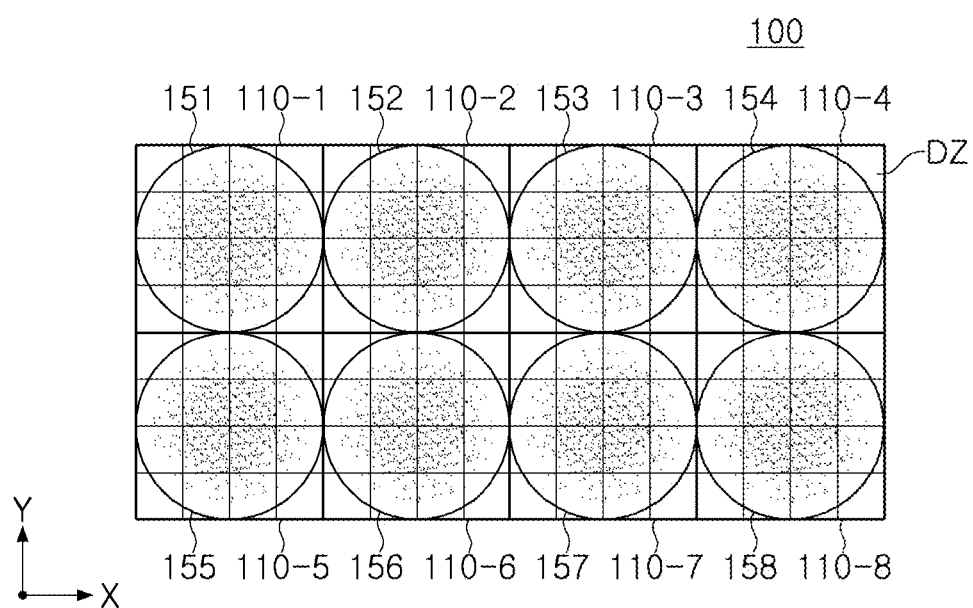

FIGS. 2A and 2B are diagrams provided to illustrate an image sensor according to at least one example embodiment of the inventive concepts of the present disclosure. FIG. 2A represents a cross-section of the image sensor in a X-Z direction while FIG. 2B represents a plane of the image sensor in a X-Y direction.

Referring to FIG. 2A, an image sensor 100 according to at least one example embodiment of the inventive concepts may include a plurality of pixels 110, a planarization layer 130 and a plurality of microlenses 150.

Each pixel may include a photodiode receiving an optical signal to generate an electric signal. The plurality of pixels 110 may receive an optical signal incident from an opening OP of a main lens portion ML through the plurality of microlens 150 and the planarization layer 130. The pixels 110 may generate an electric signal from the received optical signal and obtain an image of a subject using the generated electric signal. The main lens portion ML and microlens 150 may also be referred to in the present disclosure as the "first lens portion" and the "second lens portion," respectively.

According to at least one example embodiment of the inventive concepts, the plurality of pixels 110 are separated from each other by a plurality of pixel isolation films, thereby preventing crosstalk caused by optical interference. The pixel isolation films extend from a lower surface of the planarization layer 130 in a Z-axis direction to be disposed between the pixels 110. The pixel isolation films may be formed using a trench process, a local oxidation of silicon process, or the like. When formed by the trench process, the pixel isolation films may have a deep trench isolation (DTI) structure or a shallow trench isolation (STI) structure.

The planarization layer 130 may be formed of a light transmissive material. As used in the present disclosure, a light transmissive material is a material that transmits light. For example, the planarization layer 130 may be formed of a polyimide-based or poly acryl-based material having desired or, alternatively, excellent light transmittance. According to at least one example embodiment of the inventive concepts, the planarization layer 130 may have the same refractive index as the main lens part ML.

In addition, the planarization layer 130 may be formed in a multilayer film in which materials having different refractive indices are stacked. For example, the planarization layer 130 may be formed of a stacked film in which an oxide film and a nitride film are stacked and that in which an oxide film and a film (SiC) containing carbon atoms are stacked. Even in such cases, an overall refractive index of the planarization may have the same as that of the main lens portion ML.

The microlenses 150 may focus an optical signal incident through the main lens portion ML onto the pixels 110. The microlens 150 may be formed in various shapes. For example, all microlenses may have the same shape and circumferential radius. Alternatively, the microlenses have all different shapes and circumferential radii.

A plurality of pixels may be disposed below each of the microlenses 150. For example, 16 4×4 pixels may be disposed in the lower portion of each of the microlens. FIG. 2A illustrates a case in which 4 pixels are disposed in an X-axis direction in the lower portion of each of the microlens; however, this is merely an example, and the present disclosure should not be limited thereto. For example, 2, 6 or various numbers of pixels may be disposed in the lower portions of the microlenses in the X-axis direction.

The microlenses 150 may classify marginal rays incident through the opening OP of the main lens ML according to incidence angles thereof and deliver the same to the pixels 110.

According to at least one example embodiment of the inventive concepts, the plurality of pixels 110, the planarization layer 130 and the plurality of microlenses 150 may be integrally formed on a semi-conductive substrate. For example, an image sensor 100 according to at least one example embodiment of the inventive concepts may be integrally formed by directly forming the planarization layer 130 and the plurality of microlenses 150 in an upper portion of the plurality of pixels 110 formed on the semi-conductive substrate, instead of attaching the separately formed microlenses 150 to the upper portion of the pixels 110 and the planarization layer 130. Similarly, the image sensor 100 according to at least one example embodiment of the inventive concepts is integrally formed at a semiconductor level and thus has an effect of preventing an alignment error that may cause between the pixels 110 and the microlenses 150.

Meanwhile, the image sensor 100 may obtain a single image of a subject by combining one or more subimages obtained from the plurality of pixels 110. According to at least one example embodiment of the inventive concepts, the DOF may vary depending on a number of the subimages combined in the image sensor. For example, as the number of the subimages combined in the image sensor 100 increases, the DOF may increase.

Referring to FIG. 2B, the image sensor 100 may include a total of 8 microlenses 151 to 158 provided in every 16 4×4 pixels 110-1 to 110-8, but is merely an example and is not limited thereto. For example, the image sensor 100 may include a total of 32 microlenses provided in every 4 2×2 pixels.

An optical signal incident to the pixels 110-1 to 110-8 corresponding to each of the microlenses 151 to 158 may be detected sparsely as it moves away from a center of each of the pixels 110-1 to 110-8. As a result, an optical signal may not be detected at all or be detected sparsely in a region (dead zone; DZ) of the pixels 110-1 to 110-8, which do not overlap with the microlenses 151 to 158 on an XY plane. To eliminate such a dead zone, an image sensor 100 according to at least one example embodiment of the inventive concepts may further include a filter layer in which a color filter array and a monochrome filter are combined.

Hereinafter, a structure of the image sensor 100 according to at least one example embodiment of the inventive concepts will be described in more detail.

Figure 3:
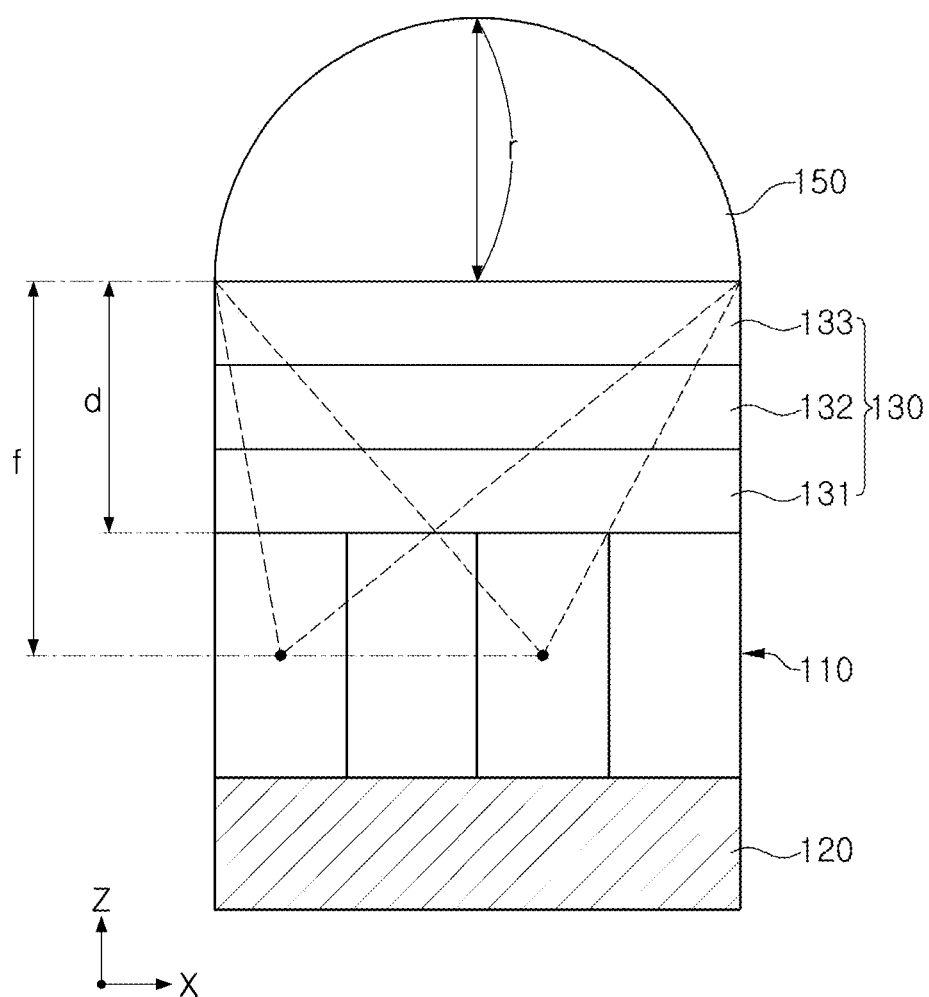
FIG. 3 is a cross-sectional view illustrating an image sensor according to at least one example embodiment of the inventive concepts.

FIG. 3 is a cross-sectional view illustrating an image sensor according to at least one example embodiment of the inventive concepts.

Referring to FIG. 3, an image sensor 100-1 according to at least one example embodiment of the inventive concepts may include a plurality of pixels 110 and circuit layers 120, a planarization 130 and a plurality of microlenses 150.

Each pixel 110 includes a photodiode and may be formed on a semi-conductive substrate with a pre-determined pitch. According to at least one example embodiment of the inventive concepts, a pitch of the pixels 110 may be 1.0 μm.

The circuit layer 120 may include at least one semiconductor element and may be formed on a semiconductor substrate. The circuit layer 120 may include a pixel driving circuit, such as a row driver, a column driver, a control logic, or the like, to obtain pixel values by driving the pixels 110. The pixel driving circuit included in the circuit layer 120 uses the pixel values obtained from the pixels 110 to obtain image information (subject image) for the subject. According to at least one example embodiment of the inventive concepts, the pixel driving circuit included in the circuit layer 120 may obtain the subject image by binning at least some of the pixel values. According to at least some example embodiments of the inventive concepts, the circuit layer 120 includes circuitry for combining multiple subimages by performing binning with respect to multiple pixels corresponding to the multiple subimages.

According to at least some example embodiments, the circuit layer 120 is an example of image processing circuitry. Accordingly, the circuit layer 120 may also be referred to in the present disclosure as the image processing circuitry 120.

According to at least some example embodiments, any or all operations described in the present disclosure as being performed by an image sensor may be performed or, alternatively, controller by the image processing circuitry 120.

The planarization layer 130 may include a light transmitting material, for example, a synthetic resin such as acryl, a glass, and the like. The planarization layer 130 may have the same refractive index as the main lens disposed between the image sensor 100-1 and the subject.

A thickness d of the planarization layer 130 may vary depending on an F-number of the main lens. For example, the F-number of the main lens may be proportional to a focal distance of the main lens and inversely proportional to the refractive index thereof. When the F-number of the main lens increases, the refractive index thereof may decrease. In this regard, the planarization layer 130 may have a relatively large thickness d so as to identically have a reduced refractive index as the main lens. When the F-number of the main lens decreases, the refractive index thereof increases. In this regard, the planarization layer 130 may have a relatively small thickness d so as to identically have an increased refractive index as the main lens. According to at least one example embodiment of the inventive concepts, the thickness d of the planarization layer 130 may be equal to or greater than 1 μm and equal to or less than 2.8 μm.

The planarization layer 130 may include first to third planarization layers 131 to 133. The first to third planarization layers 131 to 133 may have different refractive indices due to different thicknesses, etc. The first to third planarization layers 131 to 133 may be formed on the plurality of pixels 110 in order by a deposition process, or the like. The first to third planarization layers 131 to 133 may also be referred to in the present disclosure as first to third "planarization sublayers" or "sublayers" 131 to 133.

The plurality of microlenses 150 may be disposed in an upper portion of the planarization layer 130 and may be formed to have a semicircular shape having a pre-determined circumferential radius. The microlenses 150 may vary depending on the F-number of the main lens. For example, when the F-number of the main lens increases, the microlenses 150 may have a relatively large circumferential radius to maintain pre-determined light gathering power. When the F-number of the main lens decreases, the plurality of microlenses 150 may have a relatively small circumferential radius to maintain pre-determined light gathering power. According to at least one example embodiment of the inventive concepts, the circumferential radius r of the microlenses 150 may be greater than 1 μm and equal to or less than 1.8 μm.

The microlenses 150 may be provided in the pixels 110 respectively. An optical signal incident to each of the microlenses 150 may penetrate the planarization layer 130 and be transmitted to the pixels 110. The optical signal transmitted to the pixels 110 may generate a focal point in the photodiode. As a result, the focal point distance f of the optical signal, which has penetrated the microlenses 150, may be larger than the thickness d of the planarization layer 130. Thus, according to at least some example embodiments, wherein a focal length of the second lens portion (e.g., microlens(es) 150) may be greater than a thickness of the planarization layer 130. Further, a vertical distance from a lower surface of the microlens (e.g., micro lens 150) to focal points of an optical signal (or a plurality of optical signals) penetrating the planarization layer may be greater than a thickness of the planarization layer 130.

The pixels 110, the planarization layer 130 and the plurality of microlenses 150 may be formed at a wafer level on a semiconductor substrate. That is, the pixels 110, the planarization layer 130 and the plurality of microlenses 150 may be integrally formed on the semiconductor substrate.

The image sensor 100-1 according to at least one example embodiment of the inventive concepts may classify marginal rays transmitted from the subject according to incidence angles thereof and detect the same. This enables obtaining of a plurality of subimages from the optical signal, and by combining the subimages, a single image can be generated for the subject.

Hereinafter, the process in which the image sensor 100-1 classifies the marginal rays transmitted from the subject according to the incidence angles thereof and detects the same.

Figure 4A:
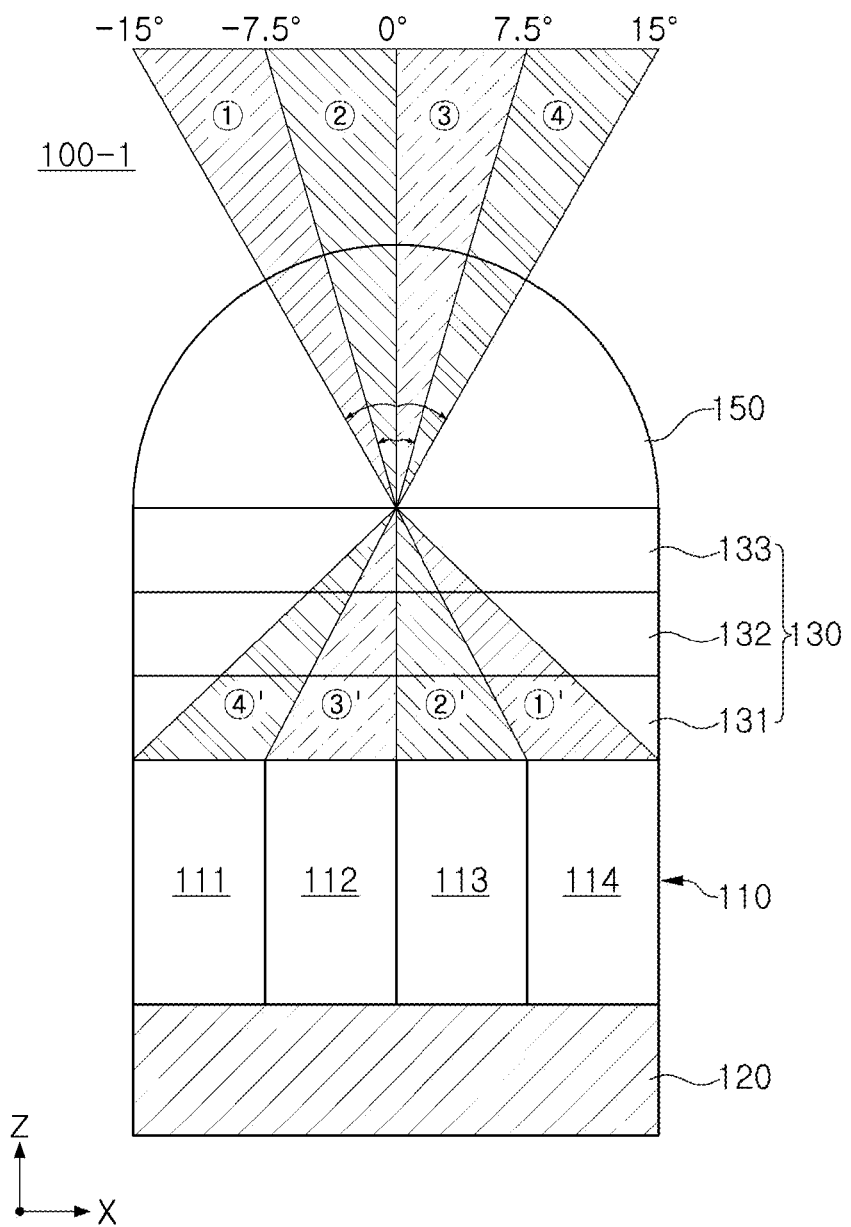
FIGS. 4A and 4B are diagram provided to describe a process in which an image sensor according to at least one example embodiment of the inventive concepts classifies and detects marginal rays transmitted from a subject for each incidence angle.
Figure 4B:
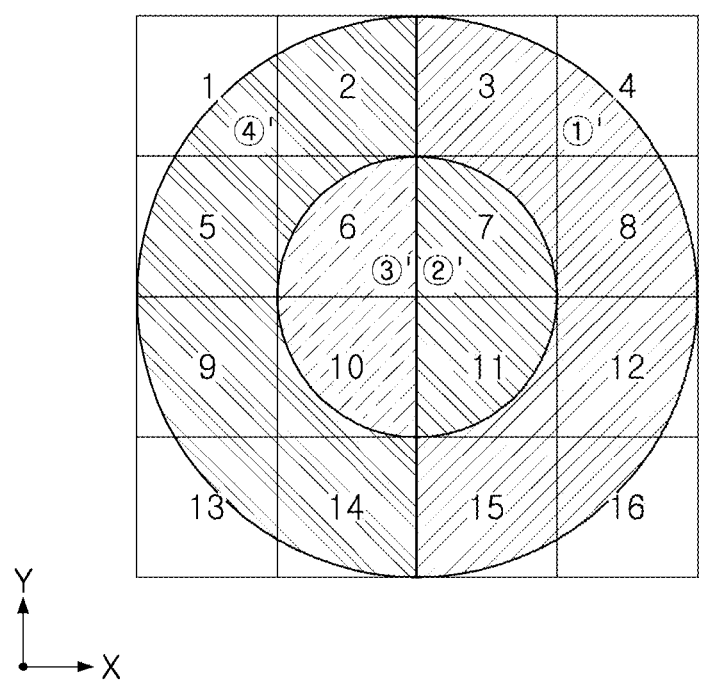

FIGS. 4A and 4B are diagram provided to describe a process in which an image sensor according to at least one example embodiment of the inventive concepts classifies and detects marginal rays transmitted from a subject for each incidence angle.

Figure 5A:
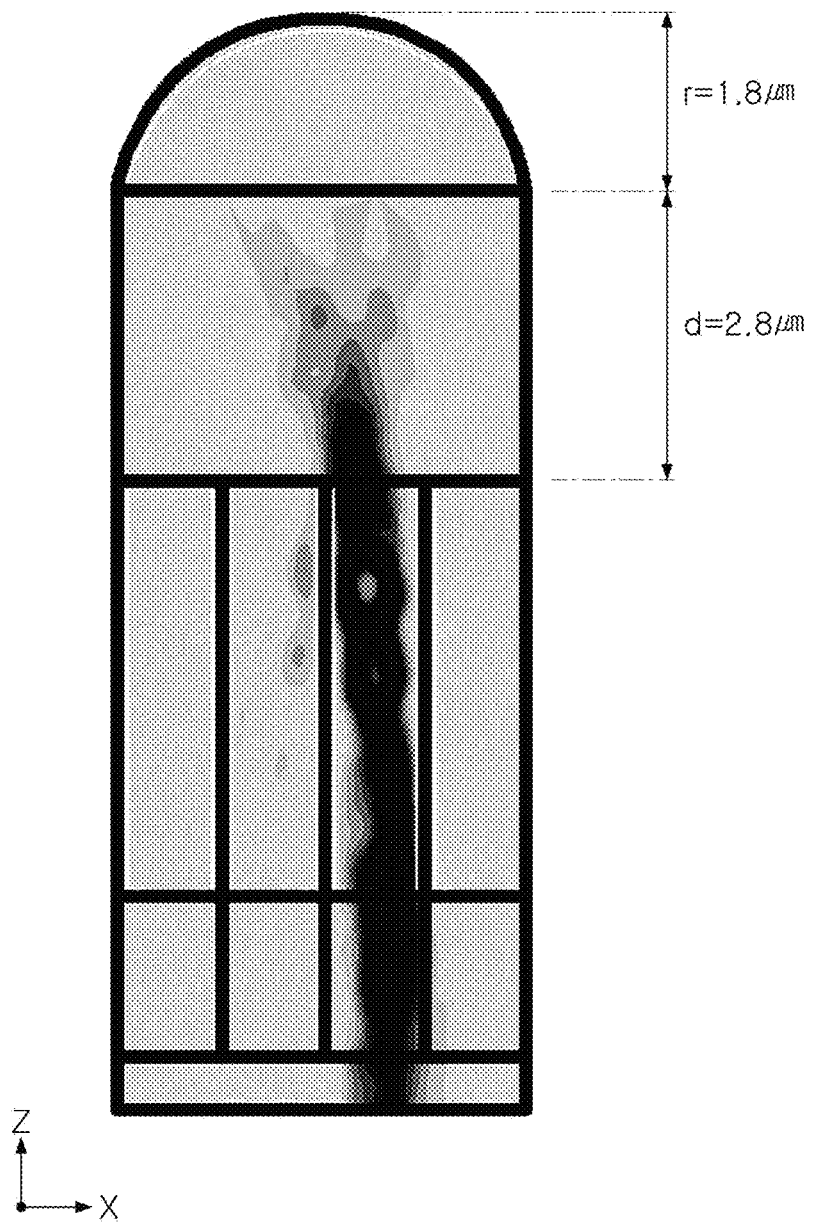
FIGS. 5A and 5B are diagrams illustrating simulated results of a path on which marginal rays are transmitted in an image sensor according to at least one example embodiment of the inventive concepts.
Figure 5B:
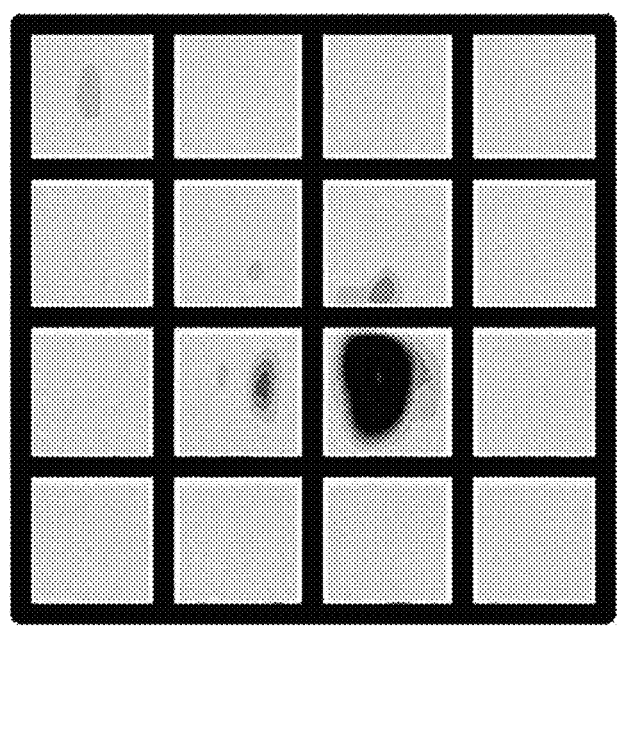

FIGS. 5A and 5B are diagrams illustrating simulated results of a path on which marginal rays are transmitted in an image sensor according to at least one example embodiment of the inventive concepts.

Referring to FIG. 4A, marginal rays having an incidence angle or, alternatively, a maximum incidence angle, of ±15° based on a central ray may be incident to the microlens 150 through the opening of the main lens.

The marginal rays incident to the microlens 150 may be classified as first to fourth marginal rays ① to ④ according to incidence angles thereof. The first marginal ray ① may have an incidence angle of at least −15° and less than −7.5°. The second marginal ray ② may have an incidence angle of at least −7.5° and less than 0°. The third marginal ray ③ may have an incidence angle of at least 0° and less than 7.5° and the fourth marginal ray ① may have an incidence angle of at least 7.5° and less than 15°.

The plurality of pixels 110 may be classified into first to fourth pixel regions 111 to 114 based on the X-axis. The focal points of the first to fourth marginal rays ① to ④ may be formed in a lower surface of the microlens 150 and classified and transmitted the first to fourth pixel regions 111 to 114 through the planarization layer 130. For example, a first marginal ray ①' which has penetrated the planarization layer 130 may be transmitted to the fourth pixel region 114. The second marginal ray ②' which has penetrated the planarization layer 130 may be transmitted to the third pixel region 113. The third marginal ray ③' which has penetrated the planarization layer 130 may be transmitted to the second pixel region 112, and the fourth marginal ray ④' which has penetrated the planarization layer 130 may be transmitted to the first pixel region 111.

Similarly, the image sensor 100-1 according to at least one example embodiment of the inventive concepts of the present disclosure classify the marginal rays incident to the microlens 150 according to the incidence angles thereof and deliver the same to the plurality of pixels 110, thereby obtaining a plurality of sampling images having different absolute positions of the subject in the images.

The region in which the plurality of marginal rays ① to ④ having different incidence angles are detected in the pixels 110 is as shown in FIG. 4B.

Referring to FIG. 4B, the first and fourth marginal rays ①' and ④' having relatively large incidence angles may be detected in relatively large regions (the third, fourth, eighth, twelfth, fifteenth and sixteenth pixels, and the first, second, fifth, eight, thirteenth and fourteenth pixels) comparatively farther from a center of the pixels 110. In contrast, the second and third marginal rays ②' and ③' having relatively small incidence angles may be detected in relatively small regions (the seventh and eleventh pixels, and the sixth and tenth pixels) comparatively closer from the center of the pixels 110.

Simulated results of a path on which marginal rays are transmitted in an image sensor according to at least one example embodiment of the inventive concepts are as shown in FIGS. 5A and 5B.

Referring to FIGS. 5A and 5B, an image sensor according to at least one example embodiment of the inventive concepts may include a microlens having a circumferential radius (or, radius of curvature) r of 1.8 μm, a planarization layer having a thickness d of 2.8 μm and 4×4 pixels disposed on a semiconductor substrate. The marginal rays having an incidence angle of greater than 0 and equal to or less than 7.5° may have a small width in the X-axis direction to be transmitted toward the semiconductor substrate and may be detected in a single pixel of the 4×4 pixels.

An image sensor according to at least one example embodiment of the inventive concepts classifies a marginal ray incident to the microlens 150 through an opening of the main lens ML according to an incidence angle and detects the same, thereby obtaining at least one sampling image. The image sensor 100 may obtain a single image (subject image) for a subject located in front of the main lens ML by binning the obtained sampling image. Herein below, a method of the image sensor 100 according to at least one example embodiment of the inventive concepts for obtaining an image will be described in more detail referring to FIGS. 6A to 11.

FIGS. 6A to 11 are diagrams provided to describe a method by which an image sensor according to at least one example embodiment of the inventive concepts obtains an image of a subject. According to at least some example embodiments, a microlens 150 may be configured to split a first optical signal incident through a main lens into a plurality of second optical signals according to an incidence angle, as is explained in greater detail below with reference to at least FIGS. 6A-11.

Figure 6A:
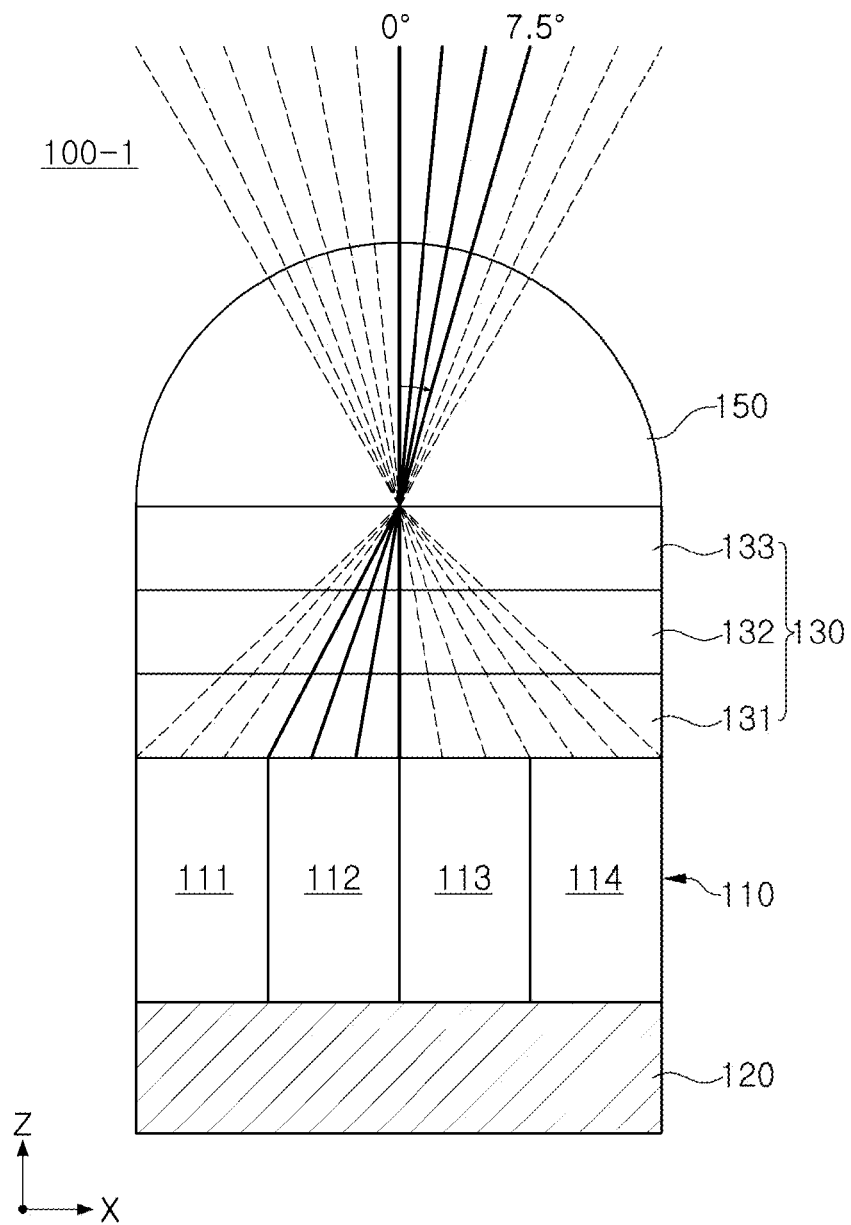
FIGS. 6A to 11 are diagrams provided to describe a method by which an image sensor according to at least one example embodiment of the inventive concepts obtains an image of a subject.

Referring to FIG. 6A, marginal rays having an incidence angle of at least 0° and less than 7.5° and incident to the microlens 150 may be transmitted to the second pixel region 112 through the planarization layer 130. The incidence angles of the marginal rays incident to the microlens 150 may be controlled by adjusting an opening width of the main lens disposed between the subject and the image sensor 100-1 using an iris.

Figure 6B:
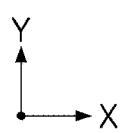
Figure 7:
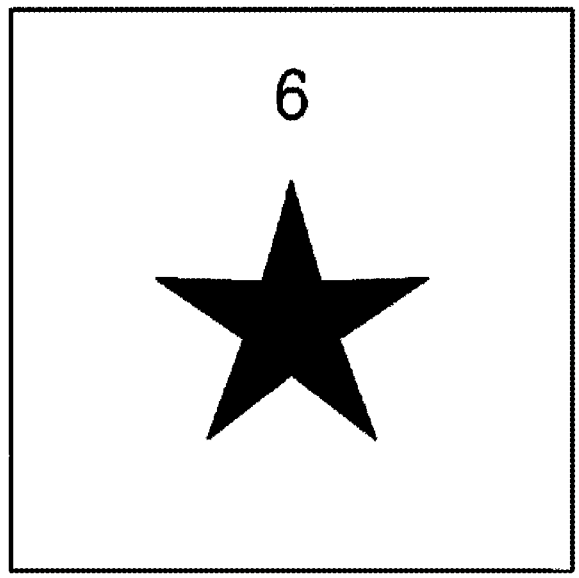

As shown in FIG. 6B, the marginal rays transmitted to the second pixel region 112 may be detected in the sixth pixel. Based on the marginal rays detected in the sixth pixel, a single sampling image may be obtained from a subject image. FIGS. 6A and 6B are exemplary cases in which an opening width of the main lens is relatively small and an F-number is relatively large. A subject image obtained therefrom may have significantly high definition as shown in FIG. 7.

Figure 8A:
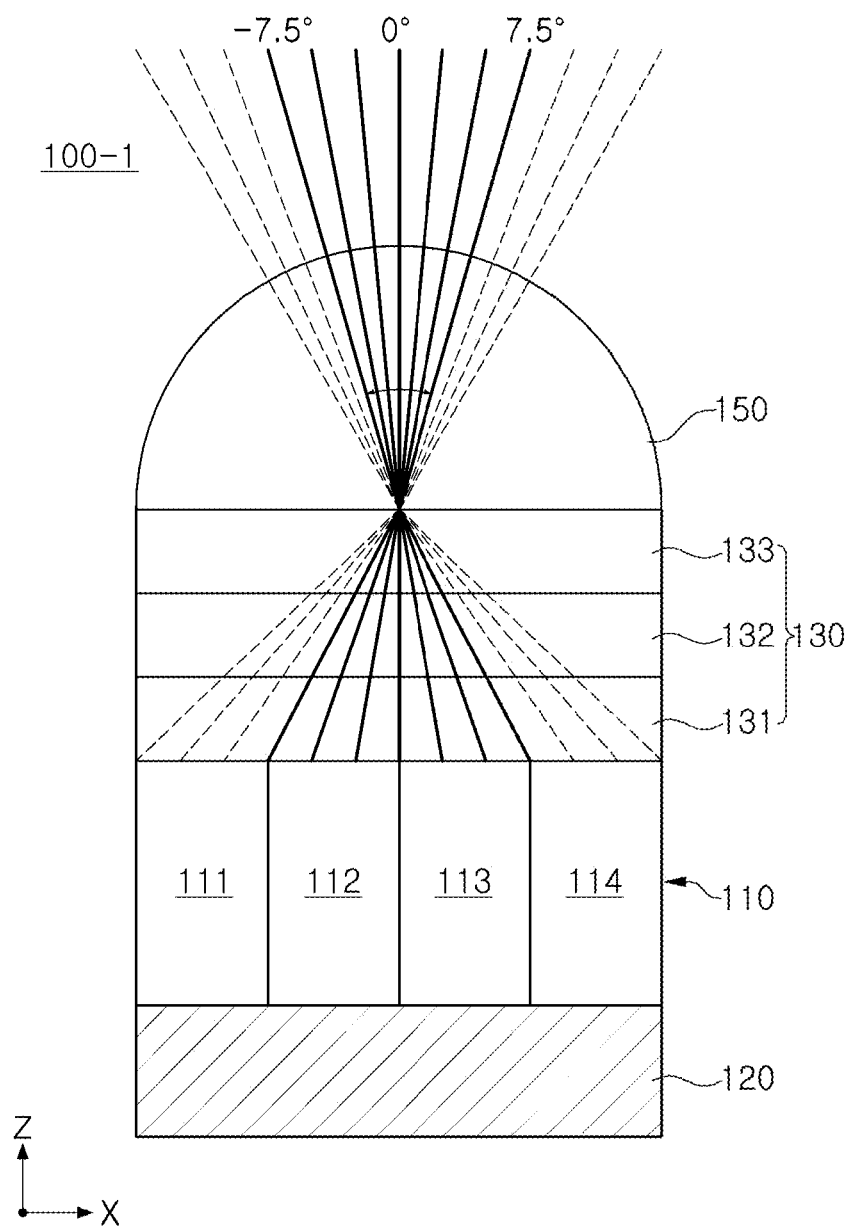

Referring to FIG. 8A, marginal rays having an incidence angle of at least −7.5° and less than 7.5° and incident to the microlens 150 may be transmitted to the second pixel region 112 and the third pixel region 113 through the planarization layer 130.

Figure 8B:
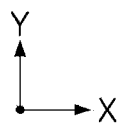
Figure 9:
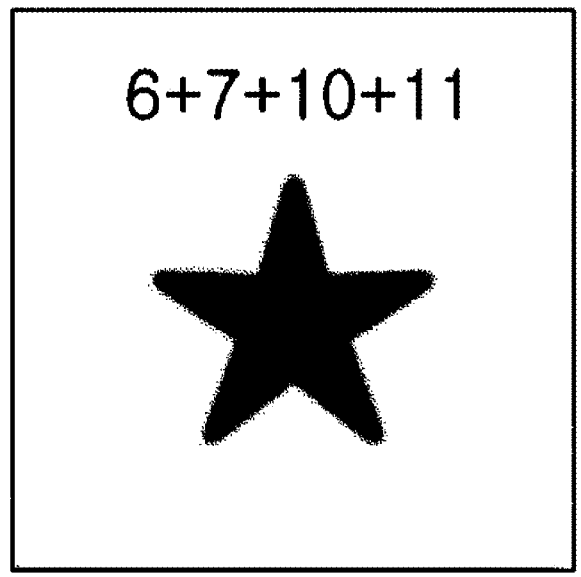

As shown in FIG. 8B, the marginal rays transmitted to the second pixel region 112 may be detected in the sixth pixel and the tenth pixel. Those transmitted to the third pixel region 113 may be detected in the seventh pixel and the eleventh pixel. Based on the marginal rays detected in the sixth, tenth, seventh and eleventh pixels, a total of 4 sampling images may be obtained. The four sampling images, as shown in FIG. 9, may have significantly high definition, and absolute positions of the subject in the sampling images may be different from each other. The image sensor 100-1 may obtain a single subject image by binning the sixth, tenth, seventh and eleventh pixels (region A), among the plurality of pixels 110, from which the marginal rays are detected. Due to the different absolute positions of the subject in the sampling images, smearing may occur in the subject image.

Figure 10A:
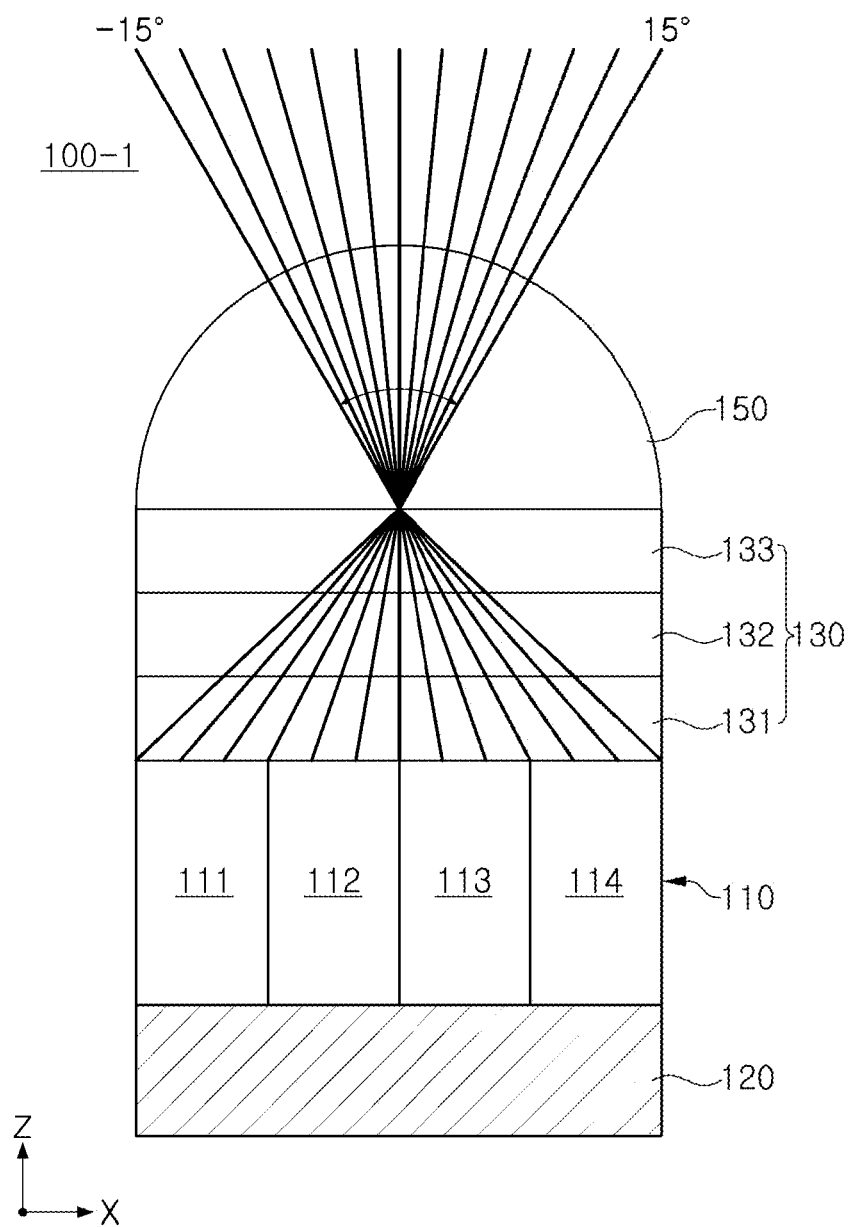
Figure 10B:
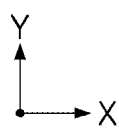
Figure 11:
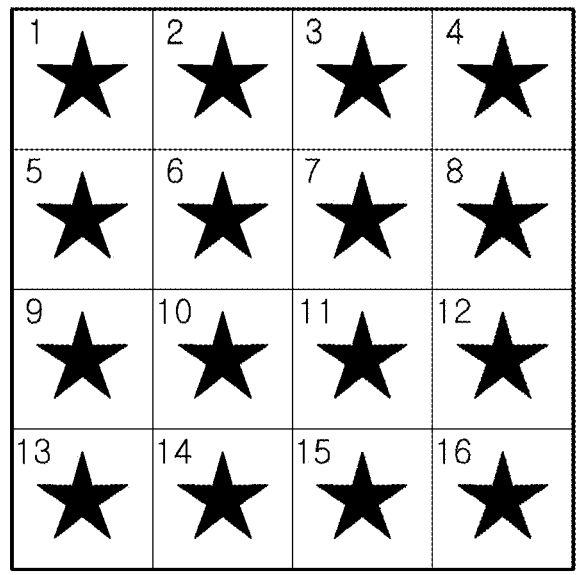
Figure 11:
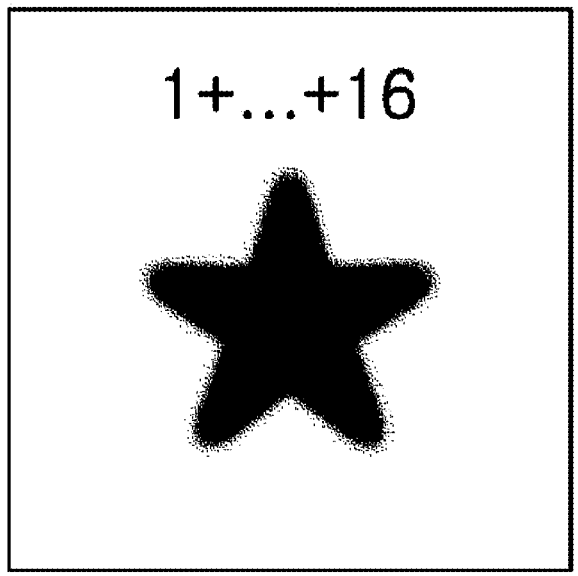

Referring to FIG. 10A, marginal rays having an incidence angle of at least −15° and less than 15° and incident to the microlens 150 may be transmitted to the first pixel region 111 to the fourth pixel region 114 through the planarization layer 130. As shown in FIG. 10B, the marginal rays transmitted to the first pixel region 111 may be detected in the first, second, fifth, ninth, thirteenth and fourteenth pixels. Those transmitted to the second pixel region 112 may be detected in the sixth and tenth pixels. Those transmitted to the third pixel region 113 may be detected in the seventh and eleventh pixels, and those transmitted to the fourth pixel region 114 may be detected in the third, fourth, eighth, twelfth, fifteenth and sixteenth pixels. Based on the marginal rays detected in the first to sixteenth pixels, a total of 16 sampling images may be obtained. The sixteen sampling images, as shown in FIG. 11, may have significantly high definition, and absolute positions of the subject in the sampling images may be different from each other. The image sensor 100-1 may obtain a single subject image by binning the entire pixels from which the marginal rays are detected. As a number of the sampling images increases, a degree of smearing occurring in a single subject image obtained according to the binning may increase.

According to at least some example embodiments of the inventive concepts, a range of incidence angles of the marginal rays increases as a width of an opening of the main lens (ML) increases. Thus, as is illustrated in FIGS. 6A-11, according to at least some example embodiments of the inventive concepts a width of an opening of the main lens ML is configured to vary, based on a number of images, among the first images, to be combined. For example, according to at least some example embodiments, the image processing circuitry 120 may control an iris of the main lens ML to widen as a number of images to be combined increases. Further, as is illustrated in at least FIGS. 6B, 8B and 10B, a distribution of a plurality of second optical signals (e.g., optical signals that correspond to the incident optical signal and are transmitted to the pixels 110 via the planarization layer 130) focused onto a photodiode becomes farther from a center of the plurality of pixels as the incidence angle of the incident optical signal increases.

Hereinafter, an image sensor according to at least another example embodiment of the inventive concepts will be described in detail.

Figure 12:
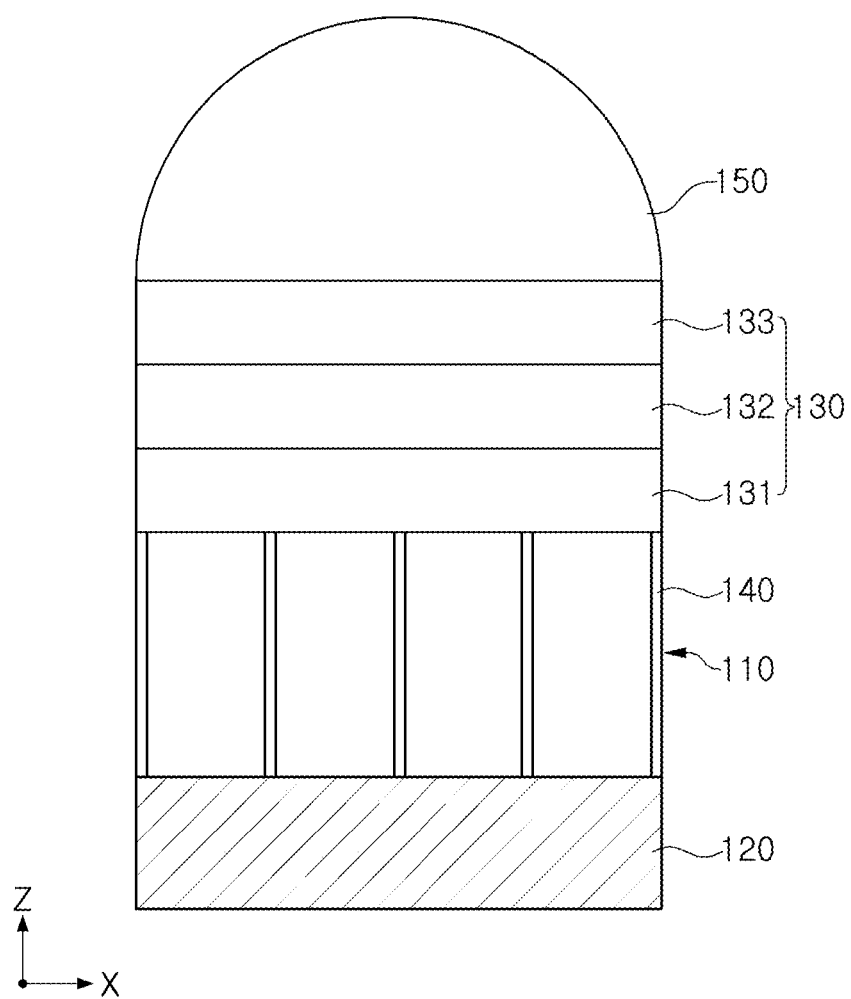
FIG. 12 is a cross-sectional view illustrating an image sensor according to at least one example embodiment of the inventive concepts.

FIG. 12 is a cross-sectional view illustrating an image sensor according to at least one example embodiment of the inventive concepts.

Referring to FIG. 12, an image sensor 100-2 according to at least another example embodiment of the inventive concepts may include a plurality of pixels 110, a periphery circuit unit 120, a planarization layer 130 and a plurality of microlenses 150. Further, the image sensor 100-2 may further include at least one element isolation layer 140 formed between the pixels 110.

The pixels 110 may include a photodiode receiving an optical signal ad generating an electric charge and a plurality of semi-conductive elements converting the electric charge generated in the photodiode into an electric signal. The plurality of pixels 110 may be arranged in the form of m×n matrix (where m and n are natural numbers) to configure a pixel array.

The element isolation layer 140 may be disposed in a Z-axis direction perpendicular to the planarization layer 130 to form a boundary between neighboring pixels 110. The element isolation layer 140 may be formed by a trench element isolation method. For example, the element isolation layer 140 may be formed by forming a trench having an appropriate depth on a semiconductor substrate and filling an insulating film inside the trench. The trench element isolation method may be classified into deep trench isolation (DTI) and shallow trench isolation methods. The trench element isolation method does not generate a bird's beak, compared to a local oxidation of silicon method, thereby preventing an active region formed on the semiconductor substrate from eroding.

Figure 13:
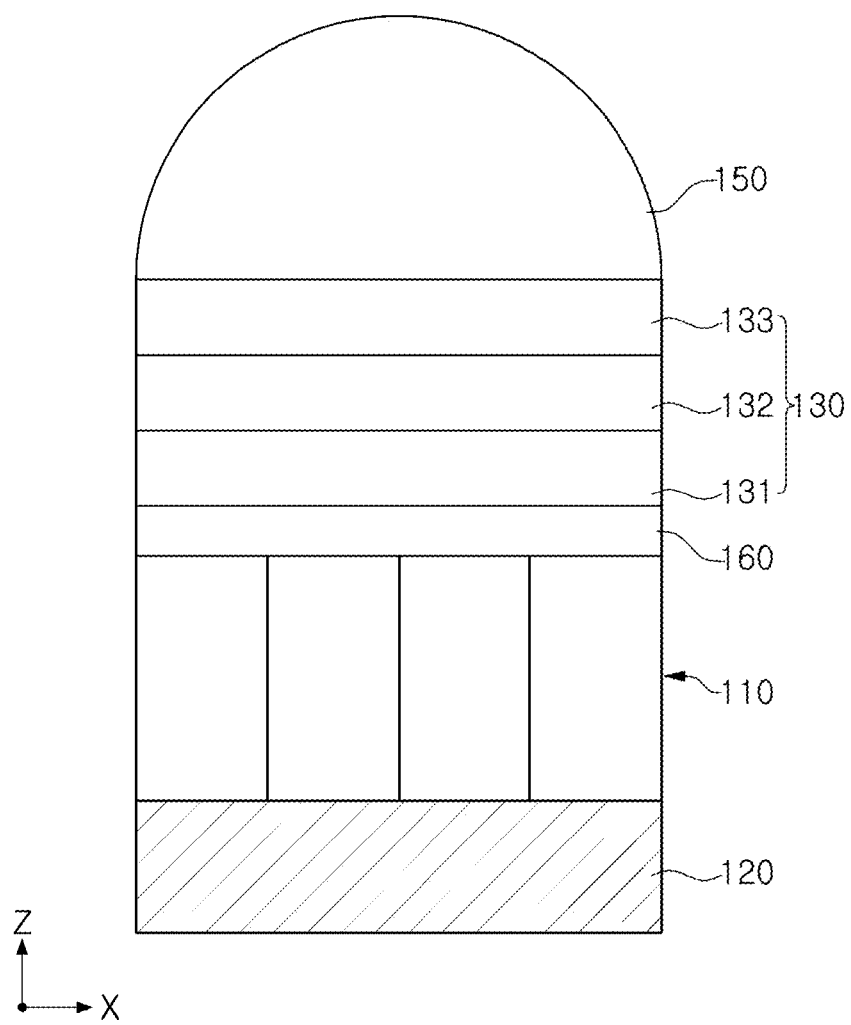
FIG. 13 is a cross-sectional view illustrating an image sensor according to at least another example embodiment of the inventive concepts.

The element isolation layer 140 may include an oxide such as hafnium oxide, polysilicon, and the like. Further, a side wall of the element isolation layer 140 may include a material having high reflectivity, for example, polysilicon doped with boron, or the lie. The element isolation layer 140 is formed of an insulating material to prevent electric crosstalk. A side wall of the element isolation layer 140, formed of a material having high reflectivity, can prevent optical crosstalk. FIG. 13 illustrates the image sensor 100-2 including 5 element isolation layers 140, but is merely an example and is not limited thereto. For example, the image sensor 100-2 may include 2 2×1 pixels 110 disposed below a single microlens 150. In this case, a single element isolation layer 140 may be disposed between two pixels 110.

FIG. 13 is a cross-sectional view illustrating an image sensor according to at least another example embodiment of the inventive concepts.

Figure 14A:
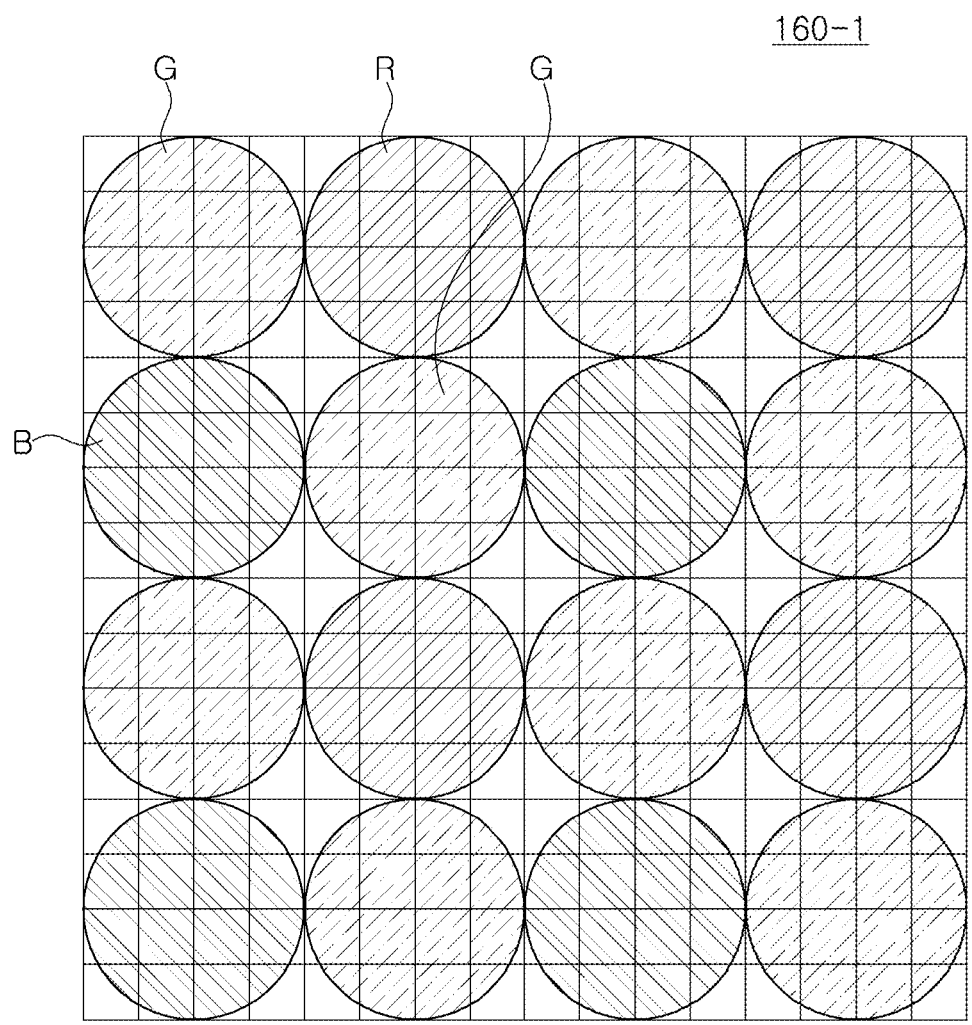
FIGS. 14A and 14B are diagrams illustrating color filters which may be included in an image sensor according to at least one example embodiment of the inventive concepts.
Figure 14B:
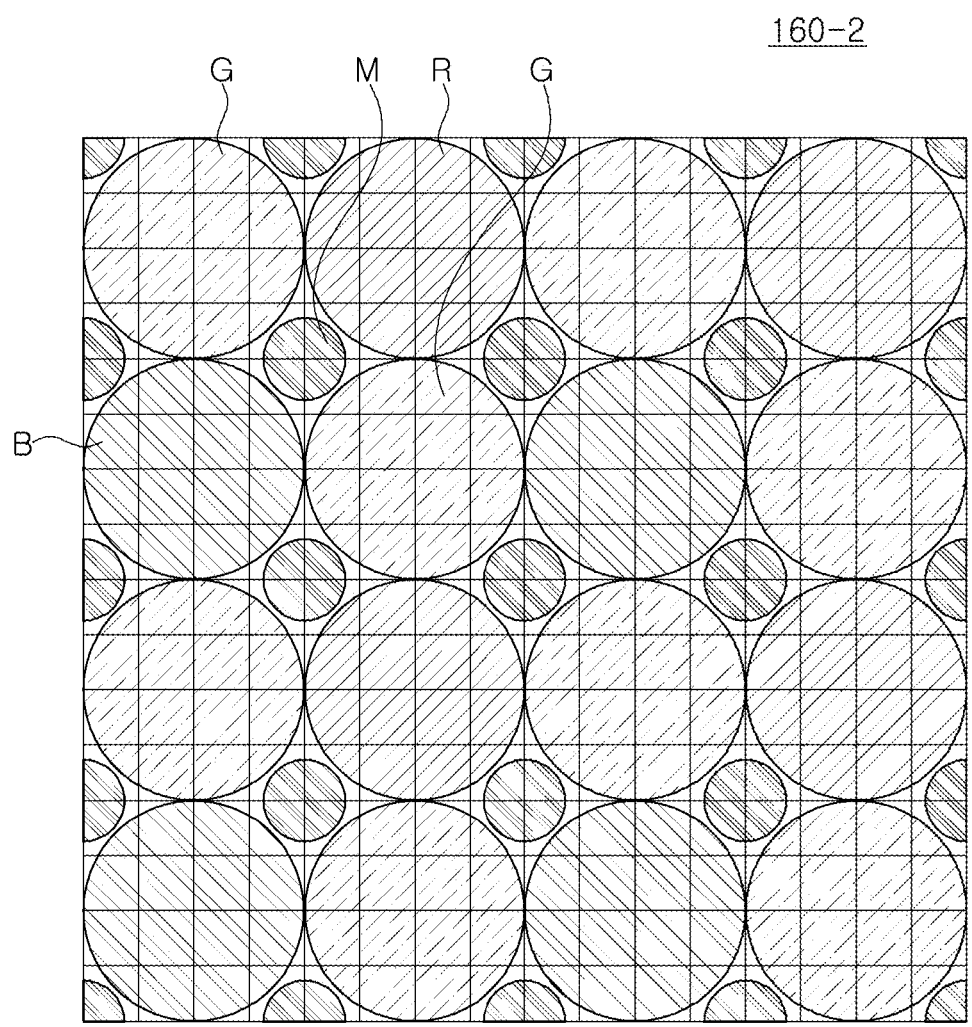

FIGS. 14A and 14B are diagrams illustrating color filters which may be included in an image sensor according to at least one example embodiment of the inventive concepts.

Referring to FIG. 13, an image sensor 100-3 according to at least one example embodiment of the inventive concepts may include a plurality of pixels 110, a periphery circuit unit 120, a planarization layer 130 and a plurality of microlenses 150. Further, the image sensor 100-3 may further include a color filter layer 160 disposed between the plurality of pixels 110 and the planarization layer 130.

The color filter layer 160 may be configured with a color filter array containing the plurality of color filters.

The color filter layer 160 may selectively transmit light having a specific wavelength (for example, red, green, blue, magenta, yellow, and cyan).

Each of the color filter included in the color filter layer 160 may be formed in a position corresponding to each of the pixels 110. Further, the color filters may be formed in a position corresponding to a reference or, alternatively, predetermined number of the pixels 110. For example, referring to FIG. 14A, the red filter R, the green filter G and the blue filter B may be formed in a bayer pattern for every 16 4×4 pixels 110 to configure the color filter layer 160. In the case in which the color filter layer 160 is formed as in FIG. 14A, each pixel 110 disposed below each color filter may be considered as a sub-pixel. Accordingly, the plurality of pixels 110 disposed below a single red filter may be considered as a single red pixel, while those disposed below a single green filter G may be considered as a single green pixel. A plurality of pixels 110 disposed below a single blue filter B may be considered as a single blue pixel.

An optical signal incident to the pixels in the lower portion of the microlens 150 may be detected to be thin as it moves away from a center of each of the pixels 110 in the lower portion. As a result, an optical signal may not be detected at all or be detected sparsely in a region (dead zone; DZ) of the pixels 110, which do not overlap with the color filters on an XY plane. To improve image quality by eliminating such a dead zone, the color filter layer 160 may further include a plurality of monochrome filters M as shown in FIG. 14B. Each monochrome filter M may be disposed in the dead zone.

Figure 15:
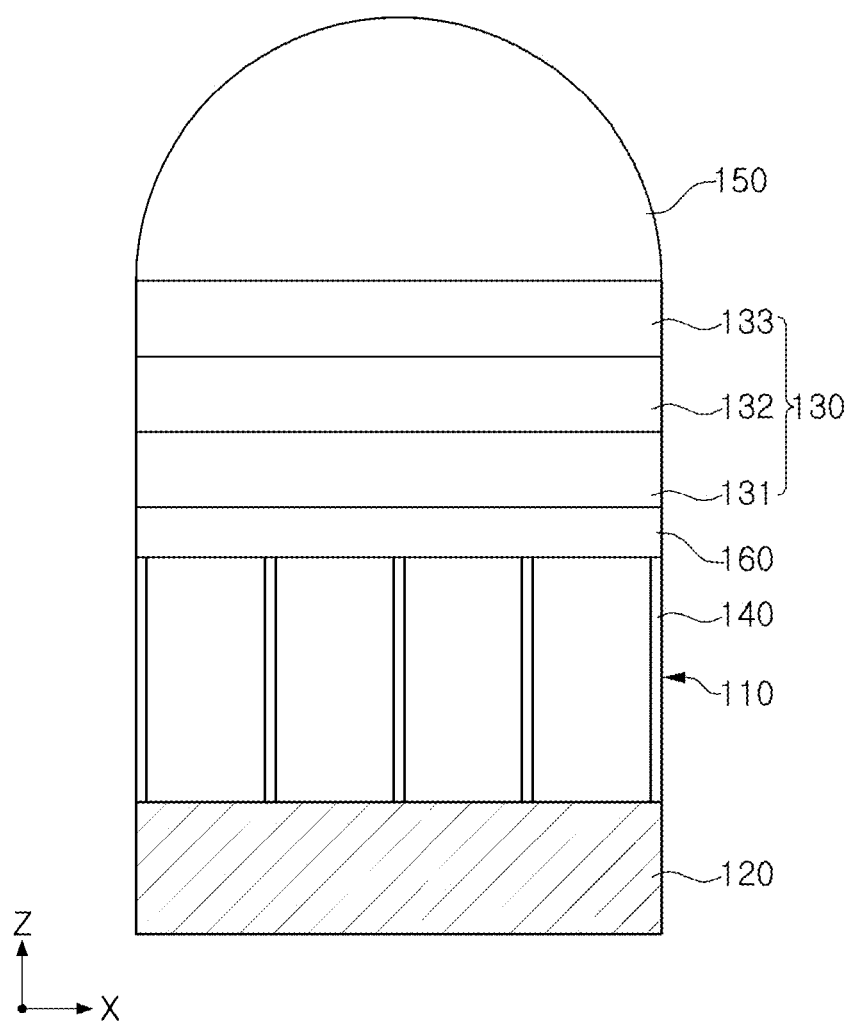
FIG. 15 is a cross-sectional view illustrating an image sensor according to at least another example embodiment of the inventive concepts.

FIG. 15 is a cross-sectional view illustrating an image sensor according to at least another example embodiment of the inventive concepts.

Referring to FIG. 15, an image sensor 100-4 according to at least one example embodiment of the inventive concepts may include a plurality of pixels 110, a periphery circuit unit 120, a planarization layer 130 and a plurality of microlenses 150. Further, the image sensor 100-4 may further include at least one element isolation layer 140 formed between the plurality of pixels 110, and a color filter layer 160 disposed between the plurality of pixels 110 and the planarization layer 130.

Figure 16:
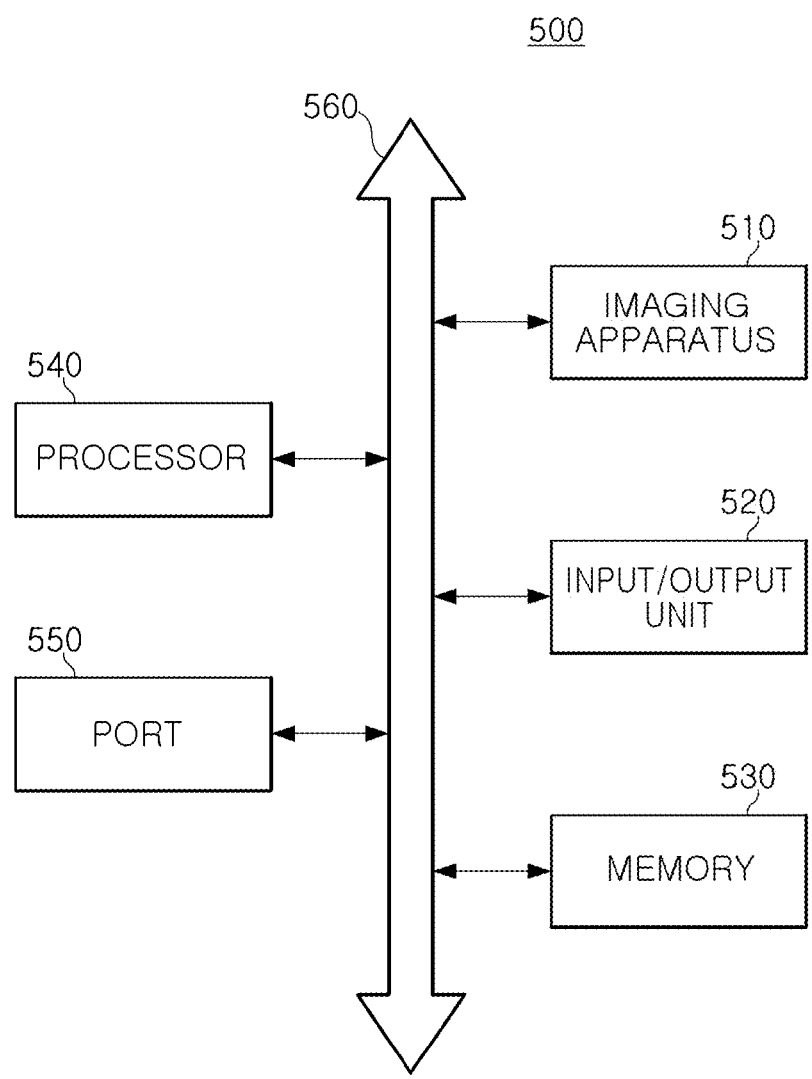
FIG. 16 is a block diagram simply illustrating an electronic device including an image sensor according to at least one example embodiment of the inventive concepts.

FIG. 16 is a block diagram simply illustrating an electronic device including an image sensor according to at least one example embodiment of the inventive concepts.

An electronic device 500 according to at least one example embodiment of the inventive concepts illustrated in FIG. 16 may include an imaging apparatus 510, an input/output unit 520, a memory 530, a processor 540, a port 550, and the like. The constitutional components, such as the imaging apparatus 510, the communication unit 520, an input/output unit 520, a memory 530, a processor 540, and a port 550, may communicate with each other via a bus 560. The electronic device 500 may further include a power apparatus, a communication unit, and the like, in addition to the illustrated constitutional components.

The processor 540 may perform certain calculations or carry out a command, a task, or the like. The processor 540 may be a central processing unit (CPU), a microprocessor unit (MCU), a system on chip (SoC), or the like, and may communicate with the imaging apparatus 510, an input/output unit 520, a memory 530, a processor 540, a port 550, and other constitutional components via a bus 560.

The imaging apparatus 510 included in the electronic device 500 illustrated in FIG. 16 may include image sensors according to the various example embodiments of the inventive concepts. As an example, the imaging apparatus 510 may operate according to the various example embodiments described based on FIGS. 1 to 15.

As set forth above, the image sensor according to example embodiments of the inventive concepts may combine one or more subimages obtained from a plurality of pixels to generate a single image of an object, thereby preventing reduction of DOF.

Further, the image sensor may effectively remove a dead zone in which optical signals are not detected by disposing a monochrome filter between a plurality of color filters.

Various advantages and effects of example embodiments of the inventive concepts are not limited to the description above.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. An image sensor, comprising:
a plurality of pixel groups arranged in a first direction and a second direction being parallel to an upper surface of a semiconductor substrate and intersecting to each other, each of the plurality of pixel groups including two or more pixels separated by an element isolation layer extending in at least one of the first direction and the second direction;
a plurality of microlenses arranged in the first direction and the second direction and disposed above the plurality of pixel groups, one of the plurality of pixel groups is disposed below one of the plurality of microlenses;
a planarization layer disposed between the plurality of microlenses and the plurality of pixel groups; and
an image processing circuitry configured to select at least one select pixel among each of the plurality of pixel groups, and generate an image using a pixel signal output by the at least one select pixel,
wherein a focal length of each of the plurality of microlenses is greater than a thickness of the planarization layer, and
the image processing circuitry adjusts a degree of smearing of a subject displayed in the image, by changing the number of the at least one select pixel selected from each of the plurality of pixel groups.

2. The image sensor of claim 1, wherein the image processing circuitry increases the degree of smearing by increasing the number of the at least one select pixel selected from each of the plurality of pixel groups, and decreases the degree of smearing by decreasing the number of the at least one select pixel selected from each of the plurality of pixel groups.

3. The image sensor of claim 1, wherein the planarization layer includes a plurality of planarization layers, and at least a portion of the plurality of planarization layers have different refractive indices.

4. The image sensor of claim 3, wherein a thickness of the planarization layer is equal to or greater than 1 μm and equal to or less than 2.8 μm.

5. The image sensor of claim 1, further comprising:
a color filter layer including a plurality of color filters disposed between the plurality of microlenses and the plurality of pixel groups,
wherein each of the plurality of color filters corresponds to each of the plurality of pixel groups, and
the image processing circuitry selects two or more select pixels from each of the plurality of pixel groups, and generates the image by binning pixel signals obtained from the two or more select pixels.

6. The image sensor of claim 5, wherein 16 pixels are disposed in 4×4 form, below each of the plurality of microlenses.

7. The image sensor of claim 5, wherein the plurality of color filters includes a plurality of red filters, a plurality of green filters and a plurality of blue filters, and
each of the plurality of red filters, each of the plurality of green filters and each of the plurality of blue filters has a circular shape.

8. The image sensor of claim 7, wherein the plurality of color filters further includes a plurality of monochrome filters, and
a size of each of the plurality of monochrome filters is smaller than a size of each of the plurality of red filters, a size of each of the plurality of green filters and a size of each of the plurality of blue filters.

9. The image sensor of claim 8, wherein each of the plurality of monochrome filters is adjacent to at least one of the plurality of red filters, at least one of the plurality of green filters and at least one of the plurality of blue filters, in the first direction and the second direction.

10. The image sensor of claim 1, wherein a radius of curvature of each of the plurality of microlenses is greater than 1 μm and equal to or less than 1.8 μm.

11. An imaging apparatus, comprising:
a main lens configured to pass an optical signal incident from a subject;
a plurality of pixels arranged in a first direction and a second direction parallel to an upper surface of a semiconductor substrate;
a plurality of pixel groups, each of the plurality of pixel groups including pixels disposed in a N×N form in the first direction and the second direction, among the plurality of pixels, wherein N is an integer equal to or greater than 2;
a plurality of microlenses disposed above the plurality of pixels, and configured to refract the optical signal passing through the main lens and incident to the plurality of pixels;
an image processing circuitry configured to generate an image using a pixel signal obtained from the plurality of pixels; and
a planarization layer disposed between the plurality of microlenses and the plurality of pixels, and including a plurality of planarization layers having different refractive indices,
wherein each of the plurality of microlenses makes the optical signal to be incident to the pixels disposed in the N×N form and included in one of the plurality of pixel groups,
a thickness of the planarization layer is greater than a radius of curvature of each of the plurality of microlenses, and
the image processing circuitry selects at least one select pixel from each of the plurality of pixel groups, and adjusts a definition of the image by changing the number of the at least one select pixel.

12. The imaging apparatus of claim 11, wherein the image processing circuitry selects the same number of the at least one select pixel from each of the plurality of pixel groups.

13. The imaging apparatus of claim 11, wherein the image processing circuitry decreases the definition of the image by increasing the number of the at least one select pixel selected from each of the plurality of pixel groups.

14. The imaging apparatus of claim 11, wherein the image processing circuitry increases the definition of the image by decreasing the number of the at least one select pixel selected from each of the plurality of pixel groups.

15. The imaging apparatus of claim 11, wherein each of the plurality of pixel groups includes a portion of pixels disposed close to a center of each of the plurality of pixel groups, and remaining pixels disposed far from the center of each of the plurality of pixel groups to surround the portion of pixels, and
the image processing circuitry increases the definition of the image by selecting the at least one select pixel only from the portion of pixels.

16. The imaging apparatus of claim 15, wherein at least a portion of the remaining pixels includes a dead zone not overlapped with the plurality of microlenses, in a direction perpendicular to the upper surface of the semiconductor substrate.

* * * * *